US012713848B2

(12) United States Patent
Cutler et al.

(10) Patent No.: US 12,713,848 B2
(45) Date of Patent: Aug. 18, 2026

(54) INORGANIC/HYBRID STRESS FILMS

(71) Applicant: Tokyo Electron Limited, Tokyo (JP)

(72) Inventors: Charlotte Cutler, Albany, NY (US); Michael Murphy, Albany, NY (US); David Conklin, Saratoga Springs, NY (US)

(73) Assignee: Tokyo Electron Limited, Tokyo (JP)

(*) Notice: Subject to any disclaimer, the term of this patent is extended or adjusted under 35 U.S.C. 154(b) by 317 days.

(21) Appl. No.: 18/306,759

(22) Filed: Apr. 25, 2023

(65) Prior Publication Data

US 2024/0363340 A1 Oct. 31, 2024

(51) Int. Cl.
*H10P 14/60* (2026.01)

(52) U.S. Cl.
CPC ...... *H10P 14/6538* (2026.01); *H10P 14/6342* (2026.01); *H10P 14/6528* (2026.01)

(58) Field of Classification Search
CPC ......... H01L 21/02348; H01L 21/02282; H01L 21/02334; H10P 14/6538; H10P 14/6342; H10P 14/6528
See application file for complete search history.

(56) References Cited

U.S. PATENT DOCUMENTS

2004/0081912 A1* 4/2004 Nagahara ................ G03F 7/039 430/326
2018/0068861 A1* 3/2018 deVilliers ........... G03F 7/70633
2021/0249375 A1* 8/2021 Eid ......................... H01L 24/29
2022/0336226 A1 10/2022 Cutler et al.

FOREIGN PATENT DOCUMENTS

CN 101924058 * 12/2010

OTHER PUBLICATIONS

Tiwale et al. "Advancing next generation nanolithography with infiltration synthesis of hybrid nanocomposite resists" J. Mater. Chem. C, 2019,7, 8803-8812 (Year: 2019).*
Ro et al, "Silsesquioxanes in nanoscale patterning applications,"Materials Today, vol. 14, Issues 1-2, 2011, p. 20-33 https://doi.org/10.1016/S1369-7021(11)70019-0. (Year: 2011).*
Shinde et al., "Spin-on silicon-nitride Films for Photo-lithography by RT Cure of Polysilzane," Journal of Photopolymer Science and Technology, vol. 23, No. 2, pp. 225-230, May 14, 2010, 6 pages.

* cited by examiner

*Primary Examiner* — Matthew L Reames
(74) *Attorney, Agent, or Firm* — Slater Matsil, LLP

(57) ABSTRACT

A method of processing a substrate that includes: loading a substrate into a deposition tool, the substrate including a major working surface and a backside surface opposite the major working surface, the major working surface including a semiconductor device structure; in the deposition tool, performing a solution-based process to form a film on the backside surface, the film being an inorganic-based film or an organic-inorganic hybrid film.

19 Claims, 9 Drawing Sheets

(BACKGROUND)

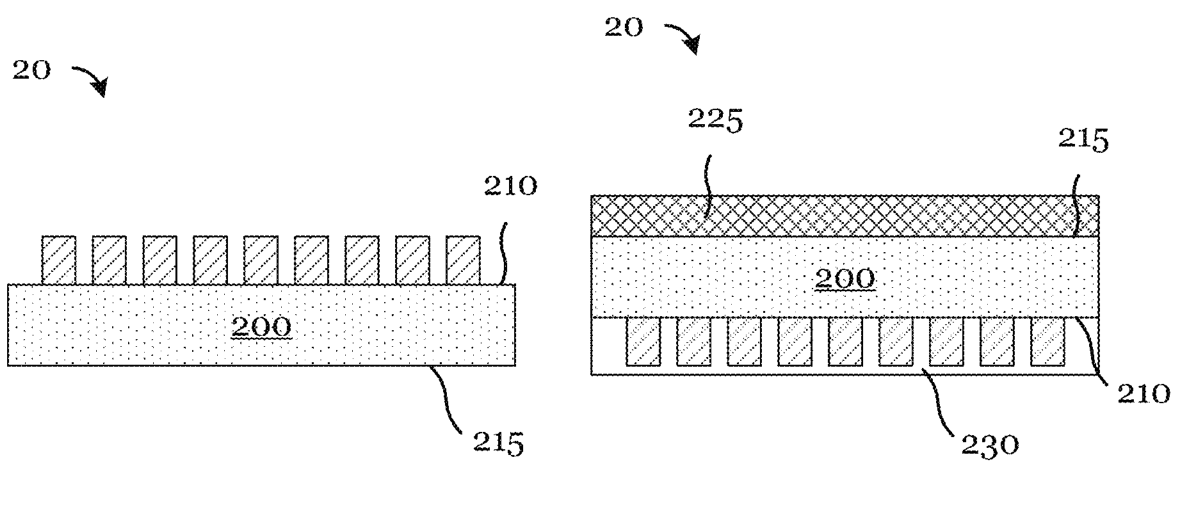
FIG. 2A
FIG. 2B
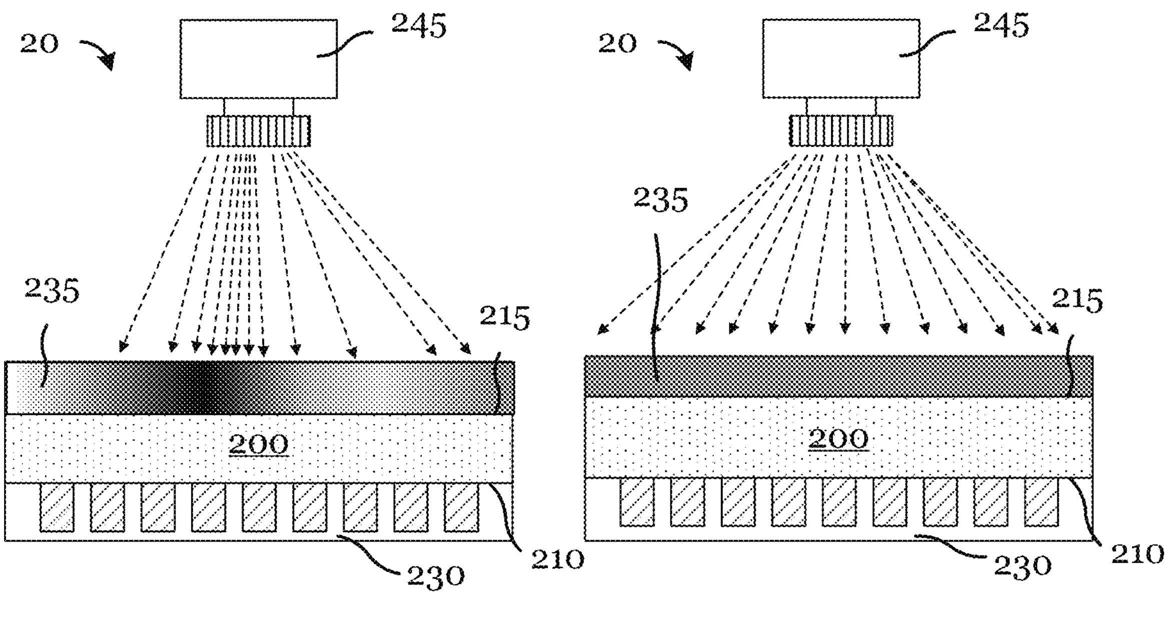
FIG. 2C
FIG. 3

$$H\!\left(O_{1.5}-\underset{}{\overset{R}{Si}}\right)_n OH \xrightarrow[\Delta]{}$$

INORGANIC/HYBRID STRESS FILMS

TECHNICAL FIELD

The present invention relates generally to methods of processing a substrate and, in particular embodiments, to inorganic/hybrid stress film.

BACKGROUND

Semiconductor fabrication involves multiple varied steps and processes. One typical fabrication process is known as photolithography. Photolithography uses radiation, such as ultraviolet or visible light, to generate fine patterns in a semiconductor device design. Many types of semiconductor devices, such as diodes, transistors, and integrated circuits, can be constructed using semiconductor fabrication techniques including photolithography, etching, film deposition, surface cleaning, metallization, and so forth.

Exposure systems (also called tools) are used to implement photolithographic techniques. An exposure system typically includes an illumination system, a reticle (also called a photomask) or spatial light modulator (SLM) for creating a circuit pattern, a projection system, and a wafer alignment stage for aligning a photosensitive resist-covered semiconductor wafer. The illumination system illuminates a region of the reticle or SLM with a preferably rectangular slot illumination field. The projection system projects an image of the illuminated region of the reticle pattern onto the wafer. For accurate projection, it is important to expose a pattern of light on a wafer that is relatively flat or planar, preferably having less than 10 microns of height deviation. Thus, a method for correcting wafer bow is desired.

SUMMARY

In accordance with an embodiment of the present invention, a method of processing a substrate that includes: loading a substrate into a deposition tool, the substrate including a major working surface and a backside surface opposite the major working surface, the major working surface including a semiconductor device structure; in the deposition tool, performing a solution-based process to form a film on the backside surface, the film being an inorganic-based film or an organic-inorganic hybrid film.

In accordance with an embodiment of the present invention, a method of processing a substrate that includes: preparing a film precursor solution by dissolving a film precursor in a solvent, the film precursor including a metal or metalloid; forming a film including the film precursor on a backside surface of a substrate from the film precursor solution using a solution-based process, the substrate including a major working surface and the backside surface opposite the major working surface, the substrate being bowed; baking the film to remove the solvent from the film; and crosslinking the film precursor to form a crosslinked network including the metal or metalloid within the film, the film reducing the degree of bowing of the substrate.

In accordance with an embodiment of the present invention, a method of processing a substrate that includes: functionalizing oxide particles including a metal or metalloid element with organic functional groups; preparing a precursor solution by dispersing the functionalized oxide particles (FP) in a solvent; forming a film including the FP on a backside of a substrate from the precursor solution using a solution-based process, the substrate including a major working surface and the backside opposite the major working surface, the major working surface including a semiconductor device feature; and baking the film to remove the solvent from the film.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2A-2C illustrate cross-sectional views of an example substrate at various stages during a semiconductor device fabrication process in accordance with various embodiments, wherein FIG. 2A illustrates the substrate comprising a device structure on a working surface, FIG. 2B illustrates the substrate with an inorganic/hybrid stress film formed on the backside of the substrate, and FIG. 2C illustrates the substrate during an exposure to a pattern of an actinic radiation;

FIG. 3 illustrates a cross-sectional view of an example substrate with a inorganic/hybrid bow modification stress film formed on the backside of the substrate after a blanket exposure to an actinic radiation in accordance with an alternate embodiment;

FIGS. 7A-7C illustrate examples of functionalized silicon oxide particle structure with various functional groups for a stress film in accordance with various embodiments, wherein FIG. 7A illustrates the particle with hydroxyl groups, FIG. 7B illustrates the particle with methyl groups, and FIG. 7C illustrates the particle with thiol groups;

FIGS. 8A-8C illustrate process flow charts of methods of forming a stress film in accordance with various embodiments, wherein FIG. 8A illustrates an embodiment, FIG. 8B illustrates another embodiment, and FIG. 8C illustrates yet another embodiment.

DETAILED DESCRIPTION OF ILLUSTRATIVE EMBODIMENTS

Figure 1:
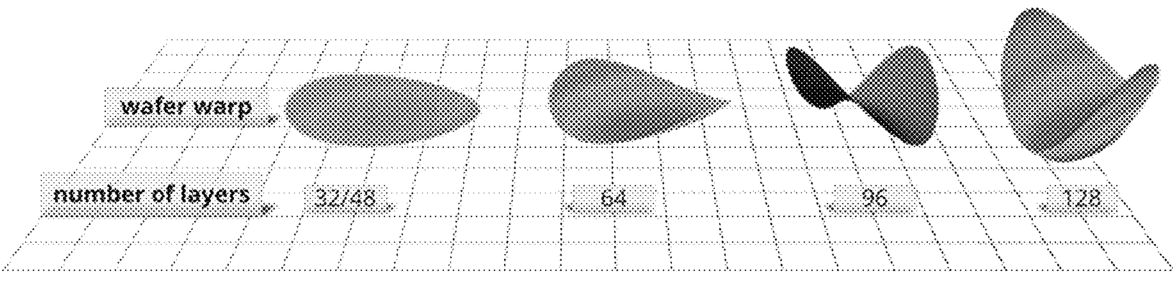
FIG. 1 illustrates substrates with various types and severities of wafer bow.

This application relates to a method of processing a substrate, more particularly to inorganic/hybrid bow mitigation stress film (referred to as stress film in this disclosure) that can mitigate the wafer bow. In the fabrication of 3D NAND memory devices, the device structures can extend vertically away from a working surface of a wafer. For example, 128 layers can be used for 3D NAND devices on a 300 mm wafer. As more and more memory is being stored on these devices, the devices become heavier. A defect in an underlying, earlier layer can be magnified to cause severe bow with later layers. FIG. 1 shows the systematic increase in the number of layers in the front side 3D NAND stack results in further wafer bow and increases the severity of the problem. This can cause issues including non-uniformities, non-planarity, overlay mis-match for lithography or other processes, and wafer handling degradation. Therefore, techniques for correcting wafer bow are desired and use of a bow mitigation stress film (stress film) is among them.

Some mitigation strategies include depositing silicon nitride films on the backside of the wafer via, for example, chemical vapor deposition (CVD), which can cause a large amount of stress on the wafer and the devices. Then, predetermined portions of the silicon nitride can be imaged, illuminated, or exposed, and subsequently removed, alleviating the stress in certain points on the wafer, hence reshaping the wafer in a different manner. The problem introduced via the silicon nitride film method is that the method requires different tooling, which can mean a simple track-based process may be incompatible, and thus it can require loading the wafers into an entirely different tool. Furthermore, the method can also be time-consuming to put the desired amount of silicon nitride on the back of the wafers. Additionally, the method is generally a very complex process to image the silicon nitride films or to tune the patterns in the silicon nitride film to alleviate the bow of the water.

A spin-on, direct write, tunable stress film can be used as an alternative to CVD-silicon nitride film to overcome the issue of tooling. The film can be coated using a coater-developer tool (also known as a track tool). The direct write process is able to induce crosslinking or additional polymerization that can bow the wafer both globally and to some extent locally. However, the spin-on stress film have been limited to organic materials and their thermal stability may not be sufficient in various subsequent semiconductor device fabrication processes. Therefore, further improvement of spin-on stress film is desired.

Various embodiments of the stress film described in this disclosure may be inorganic or hybrid (i.e., comprising organic and inorganic moieties) in nature, and may advantageously offer an improved thermal stability for a stress film. Crosslinked inorganic or hybrid films can often sustain much higher processing temperatures than organic films and may also provide a more robust back-side material for chuck contact. Further, these inorganic or hybrid materials can be formulated by spin coating using a track tool. The inorganic/hybrid stress film may comprise, for example, oxide, nitride, oxycarbide, and they may also be in form of functionalized particles in certain embodiments.

In the following, steps of inorganic/hybrid stress film formation are described referring to FIGS. 2A-2C and 3 in accordance with various embodiments. Example chemical compositions and structures for inorganic/hybrid stress film are then illustrated in FIGS. 4-6, and 7A-7C. Example process flow diagrams for inorganic/hybrid stress film formation are illustrated in FIG. 8A-8C. All figures in this disclosure are drawn for illustration purpose only and not to scale, including the aspect ratios of features.

FIGS. 2A-2C illustrate cross-sectional views of an example substrate 200 at various stages during a semiconductor device fabrication process in accordance with various embodiments. Although the substrate 200 is illustrated as flat in FIGS. 2A-2C, it may be bowed, warped, or having a curvature, which may be corrected with a bow mitigation stress film as described below.

FIG. 2A illustrates a cross-sectional view of an incoming substrate 200 comprising a device structure 20 on a working surface 210. In various embodiments, the substrate 200 may be a part of, or including, a semiconductor device, and may have undergone a number of steps of processing following, for example, a conventional process. The substrate 200 accordingly may comprise layers of semiconductors useful in various microelectronics. For example, the semiconductor structure may comprise the substrate 200 in which various device regions are formed.

In one or more embodiments, the substrate 200 may be a silicon wafer, or a silicon-on-insulator (SOI) wafer. In certain embodiments, the substrate 200 may comprise a silicon germanium wafer, silicon carbide wafer, gallium arsenide wafer, gallium nitride wafer and other compound semiconductors. In other embodiments, the substrate 200 comprises heterogeneous layers such as silicon germanium on silicon, gallium nitride on silicon, silicon carbon on silicon, as well layers of silicon on a silicon or SOI substrate. In various embodiments, the substrate 200 is patterned or embedded in other components of the semiconductor device.

As illustrated in FIG. 2A, the substrate 200 may comprise the working surface 210 and a backside surface 215. The working surface 210 of the substrate 200 can be the surface where the target devices are fabricated. The device structure 20 can be active devices or partially formed active devices such as transistors or memory cells. The pattern of the device structure 20 illustrated in FIG. 2A is only for illustration and any patterns that may be useful for the devices may be present. For the purpose of stress film formation, the substrate 200 can be received in a coating module of a coater-developer tool or other track-based tool.

In various embodiments, due to the presence of the device structure 20 and the impact of already performed fabrication processes, there may be an imbalance of stress between on the working surface 210 and the backside surface 215. In some cases, the imbalance of stress may have caused a wafer bow at any stage of the fabrication, resulting in the substrate 200 that is bowed or warped (e.g., FIG. 1). Therefore, it can be desired to mitigate this imbalance of stress or correct the bow or warp by, for example, using a bow mitigation stress film as further described below. In this disclosure, bow is used for any curvature including warp, and the term bow mitigation is used to refer any process to reduce the imbalance of stress of the substrate or correct any existing curvature (e.g., bow and/or warp) of the substrate regardless of the imbalance of stress. In other words, bow mitigation may flatten a curved surface or exert a force on any surface to increase the stiffness (e.g., Young's modulus).

FIG. 2B illustrates a cross-sectional view of the substrate 200 with an inorganic/hybrid stress film 225 formed on the backside surface 215 of the substrate 200.

Prior to performing subsequent fabrication processes on the substrate 200 illustrated in FIG. 2A, a bow mitigation stress film (stress film) may be deposited on a surface of the substrate 200 to mitigate the bow stress that may be present. In various embodiments, the stress film may be applied on the backside surface 215 of the substrate 200. The stress film may reduce the degree of bowing of the substrate 200 or reduce the imbalance of stress between on the working surface 210 and the backside surface 215. In one embodiment, the substrate 200 may have a bow with a first curvature prior to forming the stress film 225 on the backside surface 215, and after forming the stress film 225, the substrate 200 has a bow with a second curvature less than the first curvature. Alternately, the substrate 200 after forming the stress film 225 may be essentially flat with no detectable curvature on the backside surface 215.

In various embodiments, as illustrated in FIG. 2B, the substrate 200 may be flipped and the inorganic/hybrid stress film 225 (herein referred to as the stress film 225) can be formed on the backside surface 215. In certain embodiments, however, the substrate 200 may not need to be flipped. For example, the processing tool can include systems for vertically upward directed coating, spraying, or deposition. That is, the substrate 200 can continue on the track and the processing tool can form the stress film 225 on the backside surface 215 by spray coating.

In various embodiments, the stress film 225 may be an inorganic-based film. In this disclosure, the inorganic-based film may be a film whose building blocks are inorganic compounds, such that the majority of the film composition is one or more inorganic materials (e.g., >50 wt %). In various embodiments, the inorganic materials of the stress film 225 comprises a compound of a metal or metalloid element, for example, oxide, nitride, oxycarbide, or other compounds. For example, these materials may include sol-gels, nanoparticles and other networks or particles that can be formed with silicon (Si), titanium (Ti), zirconium (Zr) or the like. In one or more embodiments, the stress film 225 may comprise silicon oxide, silicon nitride, or silsesquioxane.

In other embodiments, the stress film 225 may be an organic-inorganic hybrid (hereafter referred to as hybrid in this disclosure) film. Similar to the inorganic-based film, the hybrid film may have inorganic compounds as its building blocks, but at the same time may further include organic functional groups attached to these inorganic-based building blocks. Examples of hybrid materials for the stress film 225 include various inorganic particles functionalized with organic functional groups such as hydroxyl, alkyl, thiol groups. Chemical compositions of the stress film 225 are further described referring to FIGS. 4-6 and 7A-7C.

In various embodiments, the use of inorganic or hybrid material for the bow mitigation stress film may advantageously offer a better thermal stability than organic-based stress film. Various semiconductor fabrication may involve high-temperature processes, such spin on carbon (SOC) deposition and crosslinking (higher than 400° C.) and chemical vapor deposition (CVD) processes where the substrate temperature may become as high as 800° C. The inventors of this application identified various materials described below for the stress film may withstand these temperatures.

The stress film 225 may be formed using a solution-based process such as spin-on process from a film precursor solution. Accordingly, the method of stress film formation may comprise preparing the film precursor solution by dissolving or dispersing a film precursor comprising a metal or metalloid in a solvent, and forming a film from the film precursor solution. In various embodiments, the film may be baked to remove the solvent from the film. Further, depending on the type of the stress film 225, the method may further comprise crosslinking the film precursor to a target composition of the stress film 225.

Further illustrated in FIG. 2B, in one or more embodiments, a protective fill or protective film 230 may be deposited for the device structure 20 on the working surface 210. In addition to, or in place of, the protective film 230, a carrier wafer may be attached to facilitate handling of the substrate 200.

It should be noted that the working surface 210 and the backside surface 215 are used herein to label opposing sides of the substrate 200. In some microfabrication processes, a given wafer can have active devices or power delivery structures formed on both sides. In this case, the working surface 210, the backside surface 215, or both may receive the stress film 225 depending on fabrication process stage.

In certain embodiments, the crosslinking or other chemical reactions of the film precursor for the stress film formation may be induced by an exposure to an actinic radiation. Accordingly, the film precursor may comprise one or more photo acid generators, thermal acid generators, photo initiators, photo destructive bases, or the like.

FIG. 2C illustrates a cross-sectional view of the substrate 200 during an exposure to a pattern of an actinic radiation.

In various embodiments, the stress film 225 of FIG. 2B may be exposed to a pattern of actinic radiation to induce chemical reaction such as crosslinking to induce or improve the bow modification capability of the film globally or locally. The stress film exposed to the actinic radiation is herein referred to as an exposed stress film 235 to indicate some structural/chemical change from the initial stress film (e.g., the stress film 225) after the expose. This pattern of actinic radiation may define a stress modification pattern for the film. In various embodiments, wafer bow measurement may be performed to obtain spatial information of the bowing of the substrate 200. This spatial information may be used to determine the pattern of actinic radiation and local bow mitigation can be achieved. Wafer bow measurement may be repeatedly performed the effect of applying the stress film and based on the measurement results, the steps of film formation and exposure to actinic radiation may be repeated or its recipe may be updated.

Various lithography tools can be used for the exposure step. In various embodiments, a direct-write laser or lithography tool can be used, which may be performed maskless. The direct-write system may comprise a digital light processing (DLP) chip, laser galvanometer, etc., that projects a pattern as one image or as a scan. In FIG. 2C, a direct-write projection tool 245 is illustrated. In another embodiment (not illustrated), a mask-based lithographic exposure using a scanner or stepper tool may be used. Although direct-write tools have lower resolution than mask-based tools, the resolution needed to fine tune stress can be much lower as compared to patterning transistors. Also, a stress map created with a mask can be static, whereas using a direct-write tool can be dynamic so a stress map can be created or projected and changed on a wafer-by-wafer basis if desired.

In certain embodiments, the wavelength of light (i.e., the actinic radiation) may be 365 nm, but other wavelengths may be used in other embodiments. Wavelength can be dependent on components included in a given stress film. Embodiments herein can also include using multiple films that respond to different wavelengths of light.

This exposure step may be executed within a direct write module on the coater-developer tool or be transferred to a separate or connected tool for exposure. The actinic radiation can be patterned wherein more or less radiation is received at coordinate locations on the backside surface 215 of the substrate 200. Resolution can be dependent on a particular lithography system selected for executing the exposure. Location-dependent dose of the actinic radiation may enable a variation in the degree of chemical responses (e.g., crosslinking) in the exposed stress film 235, as illustrated in FIG. 2C as gray gradient.

In one or more embodiments, after the exposure, a post exposure bake may be performed. Further, an optical curing step may also be performed. In various embodiments, these steps may be performed in a bake/curing module of the coater developer tool.

In certain embodiments, the direct write programmable pattern may essentially activate (or pre-activate) stress through cross-linking or chemical transformation that is activated by a particular wavelength of light or electromagnetic energy that can include longer wavelengths in the infrared (IR) or thermal regions. The IR wavelengths can be used to pattern the stress film 225. In some embodiments, the stress film 225, particularly when formed on the backside surface 215, may be activated using a wafer chuck with spatial temperature control either in the track device or in the device fabrication equipment. Stress activation can be tailored using different wavelengths of light based on additives to the stress film 225.

FIG. 3 illustrates a cross-sectional view of another example substrate 200 with an exposed inorganic/hybrid bow modification stress film (exposed stress film 235) in accordance with an alternate embodiment. Most of the details of the substrate 200 may be identical to those described in FIG. 2A-2C, and therefore will not be repeated.

In certain embodiments, the exposure step may be a blanket exposure without a pattern across the substrate 200, as illustrated in FIG. 3. As a result, there may be no local variation in bow mitigation ability across the exposed stress film 235, while the exposed stress film 235 may uniformly improve the stiffness of the substrate 200 and thereby improve the resistance to wafer bow during subsequent fabrication processes. In one or more embodiments, the local variation in bow mitigation ability may advantageously be introduced later when necessary, by means other than the actinic radiation exposure, for example, a thermal treatment.

In alternate embodiments, the exposure step may be optical and the stress film formation may not require actinic radiation. For example, the crosslinking or condensation of the film precursors to form a final form of stress film may be directly driven by thermal energy.

Figures 4, 5:
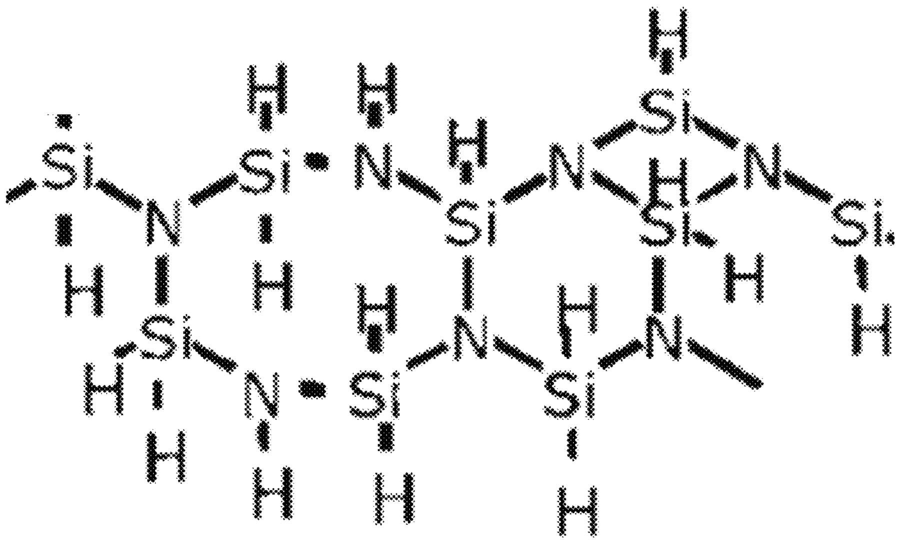
FIG. 4 illustrates a formation of an organosilane structure for a stress film in accordance with an embodiment.
FIG. 5 illustrates a silicon nitride-based structure for a stress film in accordance with an embodiment.

FIG. 4 illustrates a formation of an organosilane structure for a stress film in accordance with an embodiment.

One example of a hybrid inorganic material for stress film is that of sol-gel polymer networks such as polysiloxane, silsesquioxanes (SSQs), or SiOC materials. In FIG. 4, an organosilane monomer is condensed into a crosslinked polysiloxane network with Si—O—Si bonds, where R-represents any carbon-containing moiety (e.g., alkyl groups). In one embodiment, such a network may be formed as an SSQ network with a 3D cage structure. The polysiloxane network as a stress film may be formed by a sol-gel method or the like. For example, the organosilane monomer or partially condensed intermediate may be deposited as an initial film on a substrate by a spin-on process, followed by condensation (and crosslinking) by a thermal process, where actinic radiation exposure may be optional. Solubility and stability of the precursor and intermediate may be modulated by polymer structure and functionalization. Examples of solvent for spin-on process may include propylene glycol methyl ether (PGME) and propylene glycol methyl ether acetate (PGMEA). The amount of organic functionality (i.e., —R in FIG. 4) in the polysiloxane network may be varied by the selection of the moiety and controlling the degree of condensation/crosslinking. In various embodiments, these hybrid materials may be cured between 200-450° C. without losing the film integrity. In certain embodiments, the stress film based on the polysiloxane network may provide a thermal stability up to 700-800° C.

The inventors of this application have confirmed that, through gravimetric analysis, an example Si-based film cured at 400° C. showed only about 5 wt % loss at 810° C. The bow mitigation characteristic of the example Si-based film has been also compared to a standard spin-on-stress organic material. At a comparable film thickness after cure at 450° C., the Si-based film showed equivalent or increased primary bow to the spin-on organic stress film.

FIG. 5 illustrates a silicon nitride-based structure for a stress film in accordance with an embodiment.

In other embodiments, the stress film may comprise a silicon nitride-based polymeric structure, which may be prepared via a solution-based process (e.g., spin-on process) rather than conventional chemical vapor deposition (CVD) process. In one embodiment, as a film precursor comprising silicon and nitrogen, a polysilazane such as perhydropolysilazane may be used for film formation. The film precursor may then be processed with ultraviolet (UV) exposure (e.g., wavelength <200 nm) as an exposure step (e.g., FIGS. 2C and 3) to induce the pyrolysis of the film precursor. The resulting film may comprise a polymeric structure comprising Si, N, and H (FIG. 5).

Figure 6:
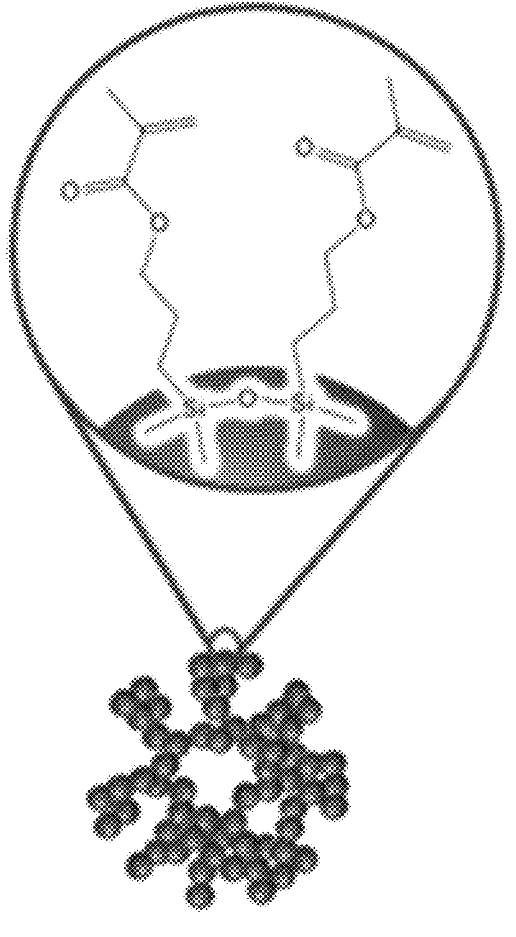
FIG. 6 illustrates a functionalized oxide particle structure for a stress film in accordance with an embodiment.

FIG. 6 illustrates a functionalized oxide particle structure for a stress film in accordance with an embodiment.

Figures 7A, 7B, 7C:
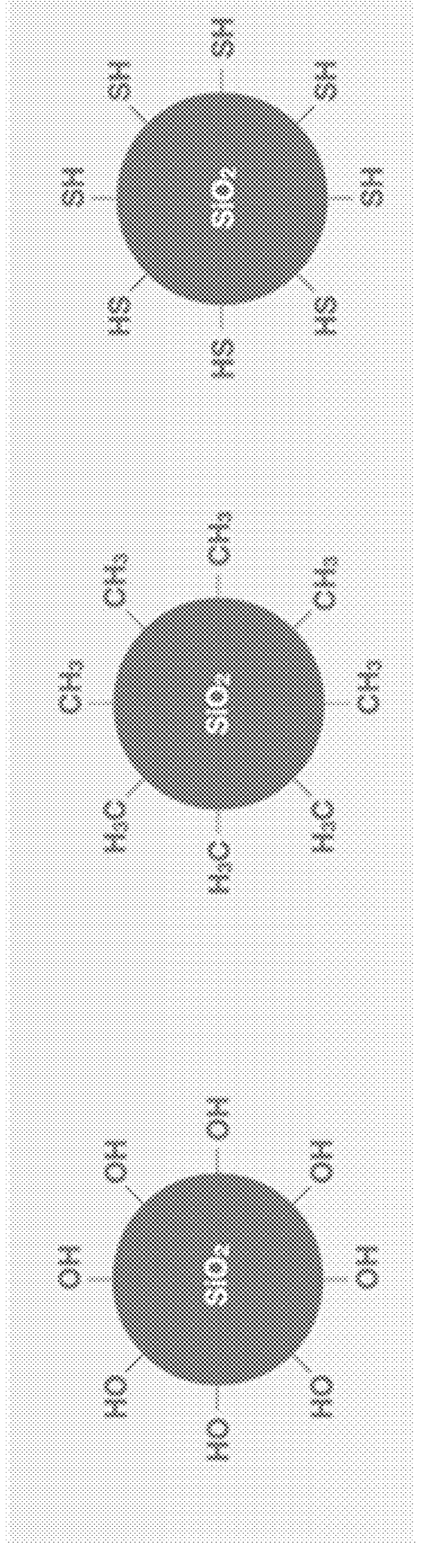
Figure 8A:
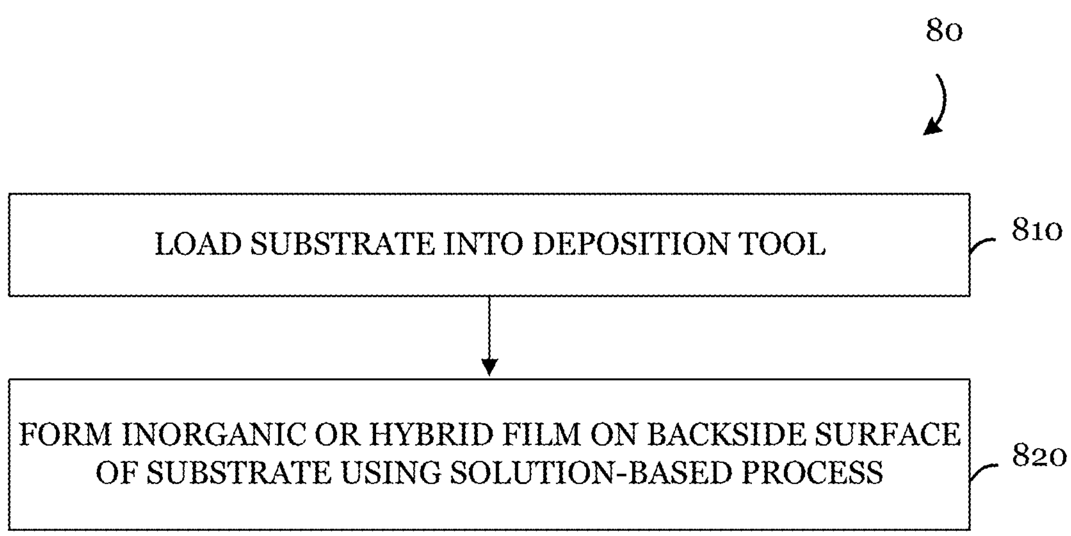
Figure 8B:
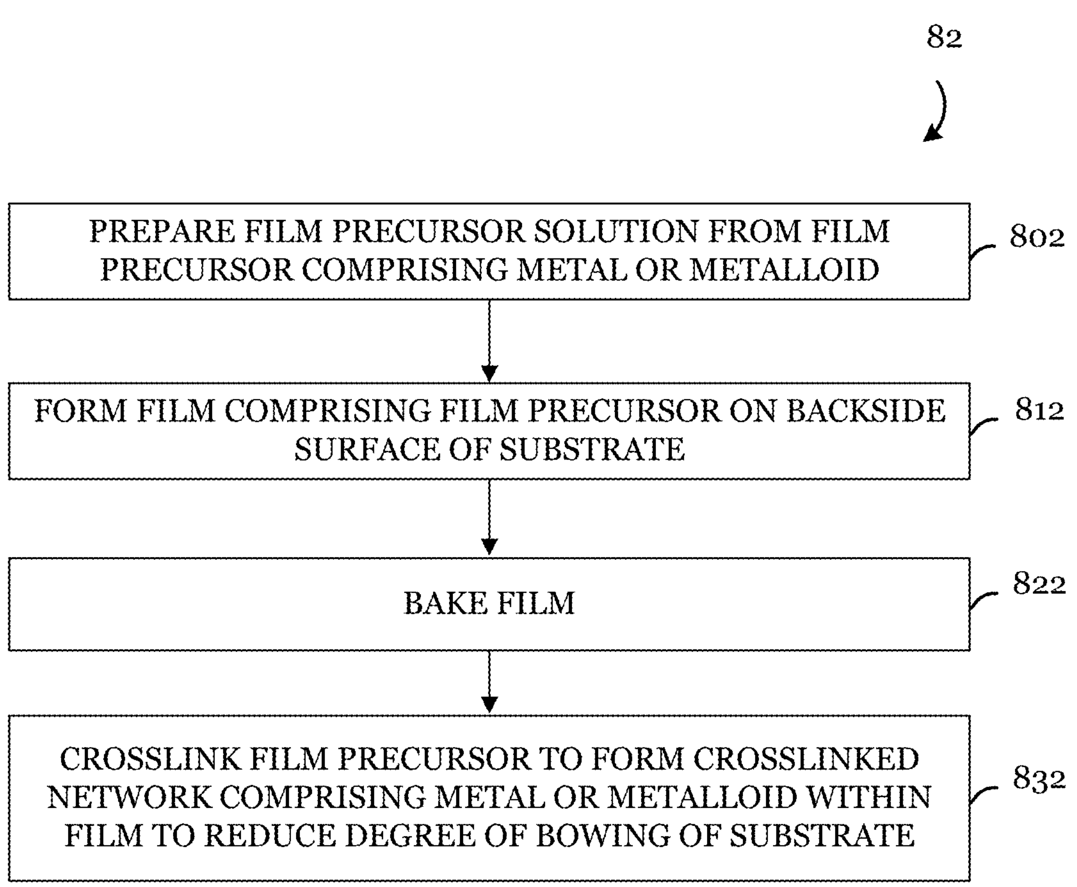
Figure 8C:
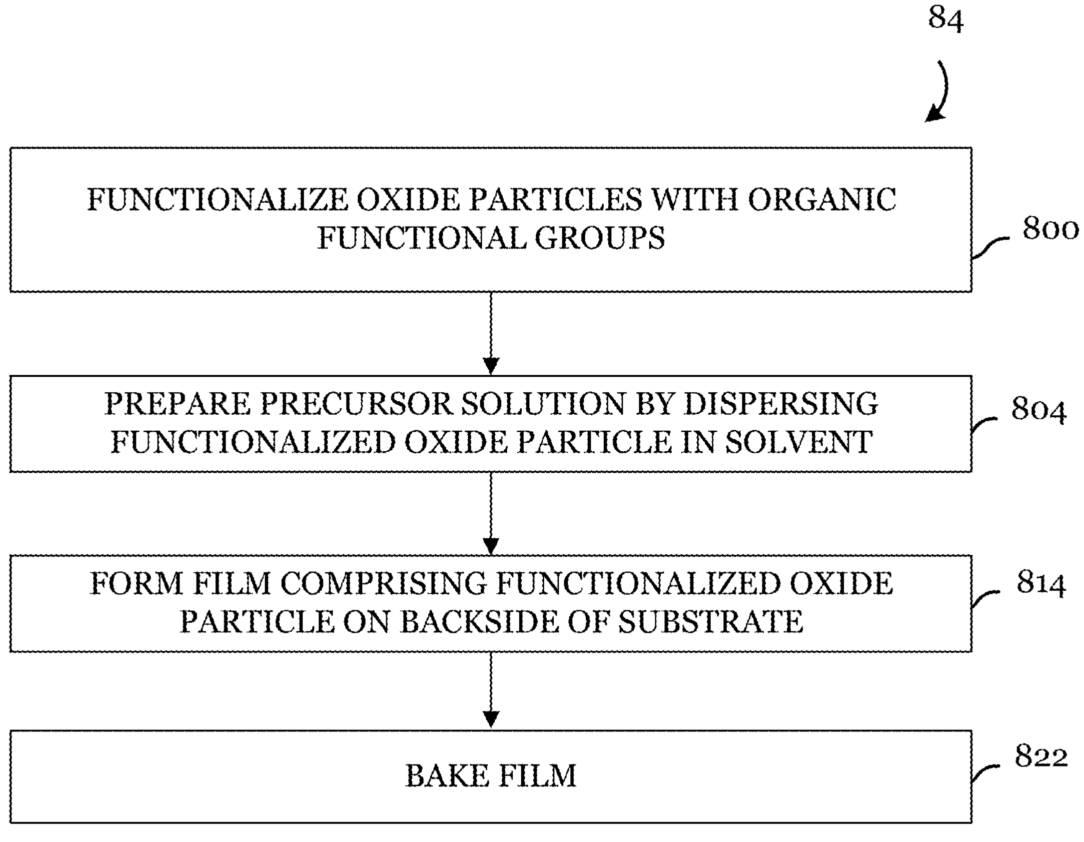

FIGS. 7A-7C illustrate examples of functionalized silicon oxide particle structure with various functional groups for a stress film in accordance with various embodiments.

Another class of materials useful for an inorganic/hybrid stress film is functionalized particles (FP). In various embodiments, the FP may have an average particle size in sub-microns or microns and generally be larger than those of nanoparticles (i.e., particles with diameters at nanometer scale), but in certain embodiments, nanoparticles may also be used. In various embodiments, the FP may have an oxide core comprising silicon oxide, titanium oxide, or zirconium among others. Typically, these types of materials are not soluble/miscible in organic solutions, but functionalizing with organic molecules may make the particles miscible in certain solvents and thereby available for solution-based process. Organic functionalization may also facilitate an avenue for various crosslinking and processability.

In various embodiments, crosslinking enables an aggregate network of FP (FIG. 6, bottom). In certain embodiments, the organic functionality of the FP may comprise an acrylate, ester or alcohol. In FIG. 6 (top), an example with propyl methacrylate is illustrated. In other embodiments, the functional groups may comprise hydroxyl groups (FIG. 7A), methyl groups (FIG. 7B), or thiol groups (FIG. 7C), although many other groups are also possible.

The material characteristics for the stress film may be tuned by controlling the reaction of these functional groups. For example, exposing the film to an actinic radiation described previously (e.g., FIGS. 2B and 3) may be used. Further, in certain embodiments, the exposure step may be followed by a curing process to cause a modified stress within the stress film sufficient to modify bow of the substrate. For example, upon exposure to light, a photoacid generator (PAG) can produce a photoacid which in turn catalyzes an epoxy crosslinking reaction upon bake and cure. The crosslinking reaction in the stress film can cause the stress mitigation.

In various embodiments, a post-deposition treatment may also be performed to control the final amount of organic material remaining in the hybrid stress, for example, in a similar way to the removal of porogens in a dielectric film. In certain embodiments, the post-deposition treatment may comprise an UV exposure treatment, a thermal treatment, or a combination thereof. Complete removal of the organic moiety results in a completely inorganic stress film. Substantial removal of organic material from the stress film may be desired in applications where only global bow mitigation is required, or where process temperatures are too high for most organic polymers. On the other hand, in certain embodiments, the presence of some organic functionality may facilitate compressive or tensile stress, and also enable forming a thicker film with greater stress mitigation that may reduce the risk of film cracking.

As described above, embodiments of spin-on process for inorganic/hybrid stress film may advantageously reduce the number and cost of steps for wafer bow mitigation, compared to CVD SiN film deposition approach, because unlike CVD, the inorganic/hybrid stress film may be deposited using a deposition module of a common track system. Further, in various embodiments, degree of wafer bow mitigation can be tuned with film composition, exposure dose, bake temperature, bake time and number of bakes. The stress film may have the characteristics or components to crosslink upon exposure to light, or crosslink after light exposure followed by a bake or cure step. The exposure to light may be perform with a pattern to enable location-dependent crosslinking, which may be particularly beneficial in local bow mitigation.

FIGS. 8A-8C illustrate process flow charts of methods of forming a stress film in accordance with various embodiments. The process flow can be followed with the figures (FIGS. 2A-2B) discussed above and hence will not be described again.

In FIG. 8A, a process flow 80 starts with loading a substrate into a deposition tool, where the substrate comprising a major working surface and a backside surface opposite the major working surface, the major working surface comprising a semiconductor device structure (block 810, FIG. 2A). Next, in the deposition tool, using a solution-based deposition process, a bow modification stress film (stress film) that is inorganic-based or organic-inorganic hybrid may be formed on the backside surface of the substrate (block 820, FIG. 2B). The stress film may advantageously reduce the degree of bowing of the substrate.

In FIG. 8B, another process flow 82 starts with preparing a film precursor solution by dissolving a film precursor comprising a metal or metalloid in a solvent (block 802), followed by forming a film comprising the film precursor on a backside surface of a substrate from the film precursor solution using a solution-based process (block 812, FIG. 2A). Next, the film may be baked to remove the solvent from the film (block 822). The film precursor may then be crosslinked to form a crosslinked network comprising the metal or metalloid within the film. (block 832). The film may reduce the degree of bowing of the substrate.

In FIG. 8C, another process flow 82 starts with functionalizing oxide particles comprising a metal or metalloid with organic functional groups (block 800), followed by preparing a precursor solution by dispersing the functionalized oxide particle in a solvent (block 804). Next, a film comprising the functionalized oxide particle may be formed on a backside of a substrate from the precursor solution using a solution-based process (block 814, FIG. 2A), and then the film may be baked to remove the solvent from the film (block 822).

Figure 9:
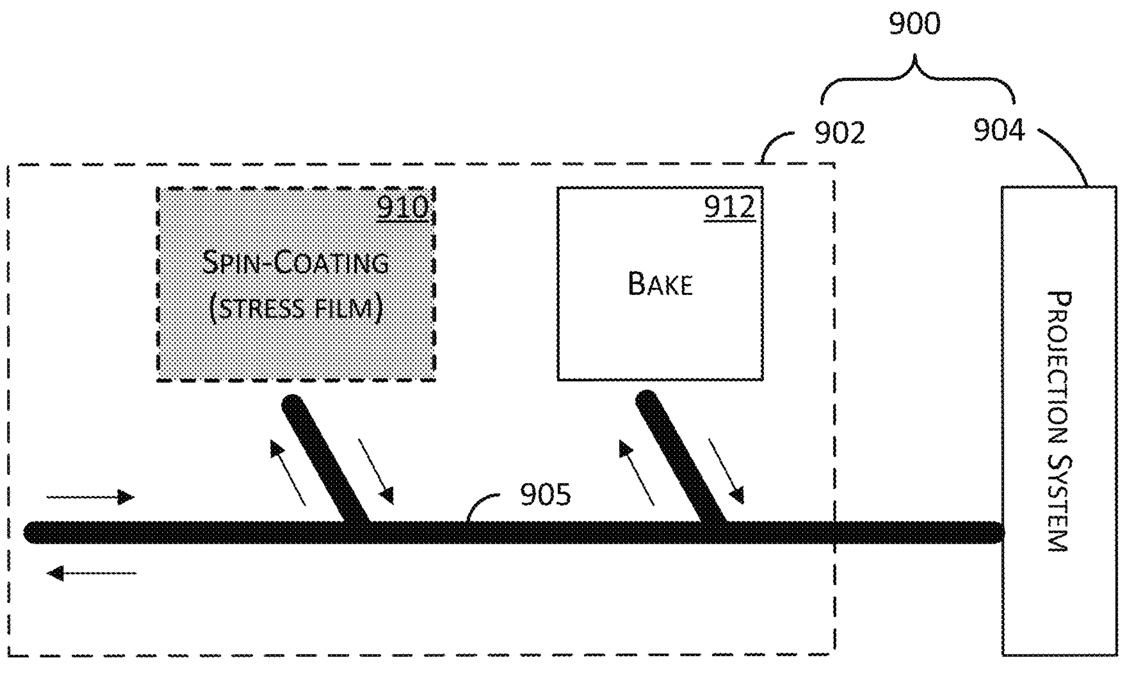
FIG. 9 illustrates a block diagram of an example coater for stress film formation in accordance with an embodiment.

FIG. 9 illustrate a block diagram of an example coater system 900 for stress film formation in accordance with an embodiment.

The coater system 900 is just one example of a coater-developer system that may be used with certain embodiments of this disclosure. In the illustrated example, the coater system 900 includes a track system 902 and a projection system 904. The projection system 904 is an optional module in certain embodiments, and may be used to perform an exposure step, previously described, to induce chemical reaction such as crosslinking to induce or improve the bow modification capability of the film globally or locally. The track system 902 includes a series of process modules assembled to allow potentially sequential execution of processes for the process being performed using the coater system 900. In various embodiments, forming a stress film may be performed before or after a photolithographic process. Accordingly, in one or more embodiments, the track system 902 may also be configured to provide the material processes such as coating the wafer with a photoresist for a lithographic process, baking the photoresist (potentially more than once), and developing the photoresist.

In the illustrated example, the process modules of the track system 902 include a spin-coating module 910 for depositing the stress film or film precursor, and a bake module 912 (e.g., for promoting crosslinking in the photoresist). In other embodiments, although not specifically illustrated, the track system 902 may further include one or more bake modules and a developing module 916 that may be useful for a typical photolithographic process.

The coater system 900 may include a transfer mechanism 905 to move a substrate from module-to-module of the track system 902, as well as from the track system 902 to the projection system 904 (which may be considered "off track") and from the projection system 904 back to the track system 902. In various embodiments, the projection system 904 may be a direct-write projection tool or a projection scanner configured to perform an exposure step for the stress film. In certain embodiments, the transfer mechanism 905 may be equipped with an arm capable of flipping the substrate such that a stress film formation may be enabled on either side of the substrate in the spin-coating module 910.

Example embodiments of the invention are summarized here. Other embodiments can also be understood from the entirety of the specification as well as the claims filed herein.

Example 1. A method of processing a substrate that includes: loading a substrate into a deposition tool, the substrate including a major working surface and a backside surface opposite the major working surface, the major working surface including a semiconductor device structure; in the deposition tool, performing a solution-based process to form a film on the backside surface, the film being an inorganic-based film or an organic-inorganic hybrid film.

Example 2. The method of example 1, where the substrate has a bow with a first curvature prior to forming the film, and where the substrate has a bow with a second curvature less than the first curvature after forming the film.

Example 3. The method of one of examples 1 or 2, where the substrate is warped prior to forming the film, and where the film reduces the degree of warp of the substrate.

Example 4. The method of one of examples 1 to 3, further including, after forming the film, processing the substrate at a process temperature at least 400° C., where the film is stable at the process temperature and provides a structural support for the substrate such that a bowing of the substrate after the processing is less than 10 μm.

Example 5. The method of one of examples 1 to 4, where the film includes silicon oxide, silicon nitride, silicon oxycarbide, or silsesquioxane.

Example 6. The method of one of examples 1 to 5, where the film includes a metal oxide, metal nitride, or metal oxycarbide.

Example 7. The method of one of examples 1 to 6, where the deposition tool is a spin-on module of a track system including a bake module, a developing module, and a transfer mechanism, further including performing a photolithographic process using the track system.

Example 8. The method of one of examples 1 to 7, further including exposing the substrate to a pattern of actinic radiation to induce crosslinking of components.

Example 9. A method of processing a substrate that includes: preparing a film precursor solution by dissolving a film precursor in a solvent, the film precursor including a metal or metalloid; forming a film including the film precursor on a backside surface of a substrate from the film precursor solution using a solution-based process, the substrate including a major working surface and the backside surface opposite the major working surface, the substrate being bowed; baking the film to remove the solvent from the film; and crosslinking the film precursor to form a crosslinked network including the metal or metalloid within the film, the film reducing the degree of bowing of the substrate.

Example 10. The method of example 9, where the solution-based process includes spin-on coating the film.

Example 11. The method of one of examples 9 or 10, where the solution-based process includes spray coating the film.

Example 12. The method of one of examples 9 to 11, where the crosslinking includes exposing the film to a pattern of an actinic radiation.

Example 13. The method of one of examples 9 to 12, further including: measuring the bowing of the substrate to obtain spatial information of the bowing; and determining the pattern of an actinic radiation based on the spatial information of the bowing, where the pattern of the actinic radiation corresponds to areas of the film that undergo the crosslinking.

Example 14. The method of one of examples 9 to 13, where the crosslinking includes thermal treating the film.

Example 15. A method of processing a substrate that includes: functionalizing oxide particles including a metal or metalloid element with organic functional groups; preparing a precursor solution by dispersing the functionalized oxide particles (FP) in a solvent; forming a film including the FP on a backside of a substrate from the precursor solution using a solution-based process, the substrate including a major working surface and the backside opposite the major working surface, the major working surface including a semiconductor device feature; and baking the film to remove the solvent from the film.

Example 16. The method of example 15, where the organic functional groups include an acrylate, ester, or hydroxyl group.

Example 17. The method of one of examples 15 or 16, further including exposing the film to a pattern of an actinic radiation to induce crosslinking of the FP.

Example 18. The method of one of examples 15 to 17, further including removing the organic functional groups from the FP.

Example 19. The method of one of examples 15 to 18, where the metal element is titanium or zirconium.

Example 20. The method of one of examples 15 to 19, where the metalloid element is silicon.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a substrate, the method comprising:

functionalizing oxide particles comprising a metal or metalloid element with organic functional groups;

preparing a precursor solution by dispersing the functionalized oxide particles in a solvent;

loading a substrate into a deposition tool, the substrate comprising a major working surface and a backside surface opposite the major working surface, the major working surface comprising a semiconductor device structure; and in the deposition tool, performing a solution-based process to form a film comprising the functionalized oxide particles on the backside surface from the precursor solution, the film being a hybrid film comprising organic and inorganic moieties.

2. The method of claim 1, wherein the substrate has a bow with a first curvature prior to forming the film, and wherein the substrate has a bow with a second curvature less than the first curvature after forming the film.

3. The method of claim 1, wherein the substrate is warped prior to forming the film, and wherein the film reduces the degree of warp of the substrate.

4. The method of claim 1, further comprising, after forming the film, processing the substrate at a process temperature of at least 400° C., wherein the film is stable at the process temperature and provides a structural support for the substrate such that a bowing of the substrate after the processing is less than 10 μm.

5. The method of claim 1, wherein the film comprises silicon oxide, silicon nitride, silicon oxycarbide, or silsesquioxane.

6. The method of claim 1, wherein the film comprises a metal oxide, metal nitride, or metal oxycarbide.

7. The method of claim 1, wherein the deposition tool is a spin-on module of a track system comprising a bake module, a developing module, and a transfer mechanism, further comprising exposing the film to actinic radiation using the track system.

8. The method of claim 1, further comprising exposing the film to a pattern of actinic radiation to induce crosslinking of components within the film.

9. A method of processing a substrate, the method comprising:

preparing a film precursor solution by dissolving a film precursor in a solvent, the film precursor comprising a polysilazane;

forming a film comprising the film precursor on a backside surface of a substrate from the film precursor solution using a solution-based process, the substrate comprising a major working surface and the backside surface opposite the major working surface, the substrate being bowed;

baking the film to remove the solvent from the film; and exposing the film to ultraviolet radiation having a wavelength less than 200 nm to induce pyrolysis of the polysilazane to form a crosslinked network comprising a silicon nitride-based polymeric structure within the film, the film reducing the degree of bowing of the substrate.

10. The method of claim 9, wherein the solution-based process comprises spin-on coating the film.

11. The method of claim 9, wherein the solution-based process comprises spray coating the film.

12. The method of claim 9, wherein exposing the film to ultraviolet radiation comprises exposing the film to a pattern of ultraviolet radiation having a wavelength less than 200 nm.

13. The method of claim 12, further comprising:
measuring the bowing of the substrate to obtain spatial information of the bowing; and
determining the pattern of the ultraviolet radiation based on the spatial information of the bowing, wherein the pattern of the ultraviolet radiation corresponds to areas of the film that undergo pyrolysis.

14. A method of processing a substrate, the method comprising:
functionalizing oxide particles comprising a metal or metalloid element with organic functional groups;
preparing a precursor solution by dispersing the functionalized oxide particles (FP) in a solvent;
forming a film comprising the FP on a backside of a substrate from the precursor solution using a solution-based process, the substrate comprising a major working surface and the backside opposite the major working surface, the major working surface comprising a semiconductor device feature; and
baking the film to remove the solvent from the film.

15. The method of claim 14, wherein the organic functional groups comprise an acrylate, ester, or hydroxyl group.

16. The method of claim 14, further comprising exposing the film to a pattern of actinic radiation to induce crosslinking of the FP.

17. The method of claim 14, further comprising removing at least a portion of the organic functional groups from the FP after the baking.

18. The method of claim 14, wherein the metal element is titanium or zirconium.

19. The method of claim 14, wherein the metalloid element is silicon.

* * * * *